(12) United States Patent
Ma

(10) Patent No.: US 12,507,541 B2
(45) Date of Patent: Dec. 23, 2025

(54) DISPLAY PANEL AND DISPLAY TERMINAL

(71) Applicant: Wuhan China Star Optoelectronics Semiconductor Display Technology Co., Ltd., Hubei (CN)

(72) Inventor: Tiyao Ma, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 1030 days.

(21) Appl. No.: 17/623,691

(22) PCT Filed: Dec. 22, 2021

(86) PCT No.: PCT/CN2021/140611
§ 371 (c)(1),
(2) Date: Jun. 23, 2023

(87) PCT Pub. No.: WO2023/108770
PCT Pub. Date: Jun. 22, 2023

(65) Prior Publication Data
US 2024/0122000 A1  Apr. 11, 2024

(30) Foreign Application Priority Data
Dec. 16, 2021  (CN) .......................... 202111542204.4

(51) Int. Cl.
*H10K 59/131* (2023.01)
*H10K 59/80* (2023.01)

(52) U.S. Cl.
CPC ....... *H10K 59/131* (2023.02); *H10K 59/8791* (2023.02)

(58) Field of Classification Search
None
See application file for complete search history.

(56) References Cited

U.S. PATENT DOCUMENTS

2004/0178725 A1* 9/2004 Karasawa .......... H10K 59/8791
313/506

FOREIGN PATENT DOCUMENTS

| CN | 102969457 | 3/2013 |
|----|-----------|--------|
| CN | 110544704 | 12/2019 |
| CN | 111599284 | 8/2020 |
| CN | 112652617 | 4/2021 |
| CN | 112687184 | 4/2021 |

OTHER PUBLICATIONS

International Search Report and the Written Opinion Dated Apr. 26, 2022 From the International Searching Authority Re. Application No. PCT/CN2021/140611 and Its Translation Into English. (17 Pages).

* cited by examiner

*Primary Examiner* — Kyoung Lee

(57) ABSTRACT

Embodiments of the present application provide a display panel and a display terminal. The display panel includes: at least one display component, a driving substrate, and a conductive member. The at least one display component includes at least one at least one via group. Each of the at least one via group includes a groove and a plurality of sub vias. The sub vias are connected between the at least one first terminal and the groove. The conductive member is at least filled in the groove and the sub vias. In the present embodiments, by disposing the sub vias, a process window in a laser drilling process can be increased.

20 Claims, 8 Drawing Sheets

DISPLAY PANEL AND DISPLAY TERMINAL

RELATED APPLICATIONS

This application is a National Phase of PCT Patent Application No. PCT/CN2021/140611 having International filing date of Dec. 22, 2021, which claims the benefit of priority of Chinese Patent Application No. 202111542204.4 filed on Dec. 16, 2021. The contents of the above applications are all incorporated by reference as if fully set forth herein in their entirety.

TECHNICAL FIELD AND BACKGROUND OF THE INVENTION

The present disclosure relates to the display technology field, and more particularly to a display panel and a display terminal.

Display panels are widely used in people's lives. In the production manufacturing of large-size display panels, such as large-size organic light-emitting display panels (OLEDs), the problems of great manufacturing difficulty and low yield rates still exist. Therefore, a method for splicing small-size display components to form a large-size display panel is developed. In a spliced large-size display panel, multiple small-size display components are spliced and disposed on a large-size driving substrate. Each of the display components includes an array functional layer and a light-emitting functional layer. The array functional layer is equivalent to various film layers on an array substrate. The array functional layer includes thin film transistors (TFTs), data lines, scan lines and so on. The light-emitting functional layer can include multiple light-emitting devices. The driving substrate includes wirings and circuits for driving each of the display components to display an image. Each of the display components includes a first terminal, and the driving substrate includes a second terminal. After the first terminal is electrically connected to the second terminal, the driving substrate can drive each of the display components to display an image.

However, in the prior art, only an integral via is disposed between the first terminal of each of the display components and the corresponding second terminal on the driving substrate. When an electrical connection is made through the integral via, the integral via easily penetrates the first terminal in a laser drilling process due to a small thickness of the first terminal. Accordingly, the electrical connection between each of the display components and the driving substrate is poor, a yield rate of the display panel is decreased, and a drilling process window is small.

Embodiments of the present disclosure provide a display panel and a display terminal capable of solving the problems that in the prior art, the electrical connection between each of the display components and the driving substrate is poor, a yield rate of the display panel is decreased, and a drilling process window is small.

An embodiment of the present disclosure provides a display panel including:
- at least one display component, wherein the at least one display component includes a first substrate, at least one first terminal disposed on the first substrate, and a light-emitting layer, and the light-emitting layer is electrically connected to the at least one first terminal;
- a driving substrate including a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and
- a conductive member electrically connected between the at least one first terminal and the corresponding one of the second terminals; and
- wherein the at least one display component includes at least one via group, the via group is disposed between the at least one first terminal and the corresponding one of the second terminals, each of the at least one via group includes a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias.

Optionally, in some embodiments of the present disclosure, the sub vias further extend into the at least one first terminal or the sub vias penetrate the at least one first terminal.

Correspondingly, An embodiment of the present disclosure provides a display terminal including a terminal body and a display panel. The terminal body and the display panel are combined as one. The display panel includes:
- at least one display component, wherein the at least one display component includes a first substrate, at least one first terminal disposed on the first substrate, and a light-emitting layer, and the light-emitting layer is electrically connected to the at least one first terminal;
- a driving substrate including a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and
- a conductive member electrically connected between the at least one first terminal and the corresponding one of the second terminals; and
- wherein the at least one display component includes at least one via group, the via group is disposed between the at least one first terminal and the corresponding one of the second terminals, each of the at least one via group includes a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias.

Optionally, in some embodiments of the present disclosure, the sub vias further extend into the at least one first terminal or the sub vias penetrate the at least one first terminal.

The embodiments of the present disclosure provide a display panel and a display terminal. The display panel includes: at least one display component, wherein the at least one display component includes a first substrate, at least one first terminal disposed on the first substrate, and a light-emitting layer, and the light-emitting layer is electrically connected to the at least one first terminal; a driving substrate including a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and a conductive member electrically connected between the at least one first terminal and the corresponding one of the second terminals; and wherein the at least one display component includes at least one via group, the via group is disposed between the at least one first terminal and the corresponding one of the second terminals, each of the at least one via group includes a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias. In the present embodiments, by disposing the at least one via group including the groove and the sub vias, side contact between the conductive member and the at least one first terminal can also be achieved even if the at least one first terminal is penetrated in a laser drilling process. A process window in the laser drilling process can be increased to increase a yield rate of the drilling process. Furthermore, by disposing the groove, a contact area between the conductive member and the at least one first terminal is increased, thereby increasing contact between the conductive member and the at least one first terminal.

BRIEF DESCRIPTION OF THE SEVERAL VIEWS OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

DETAILED DESCRIPTION OF SPECIFIC EMBODIMENTS OF THE INVENTION

Figure 1:
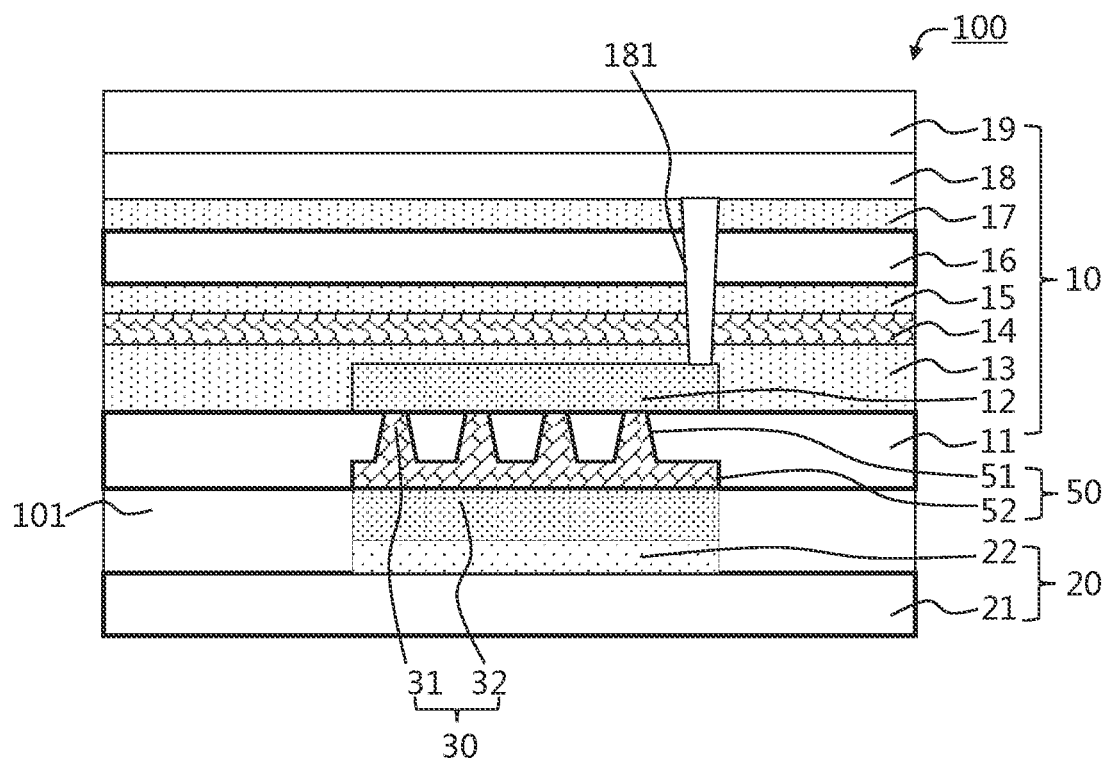
FIG. 1 illustrates a first schematic diagram of a display panel provided by an embodiment of the present disclosure.

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure. Furthermore, it should be understood that specific implementations described herein are only used to illustrate and explain the present disclosure, and are not used to limit the present disclosure. In the present disclosure, if no explanation is made to the contrary, used orientation words, such as "upper" and "lower", generally refer to upper and lower directions of a device in an actual use or a working state, and specifically refer to drawing directions in the drawings. Words "inner" and "outer" refer to an outline of a device.

An embodiment of the present disclosure provides a display panel including: at least one display component, wherein the at least one display component includes a first substrate, at least one first terminal disposed on the first substrate, and a light-emitting layer, and the light-emitting layer is electrically connected to the at least one first terminal; a driving substrate including a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and a conductive member electrically connected between the at least one first terminal and the corresponding one of the second terminals; and wherein the at least one display component includes at least one via group, the via group is disposed between the at least one first terminal and the corresponding one of the second terminals, each of the at least one via group includes a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias.

Embodiments of the present disclosure provide a display panel and a display terminal which are respectively described in detail below. It should be noted that the order of description in the following embodiments is not meant to limit the preferred order of the embodiments.

First Embodiment

Figure 2:
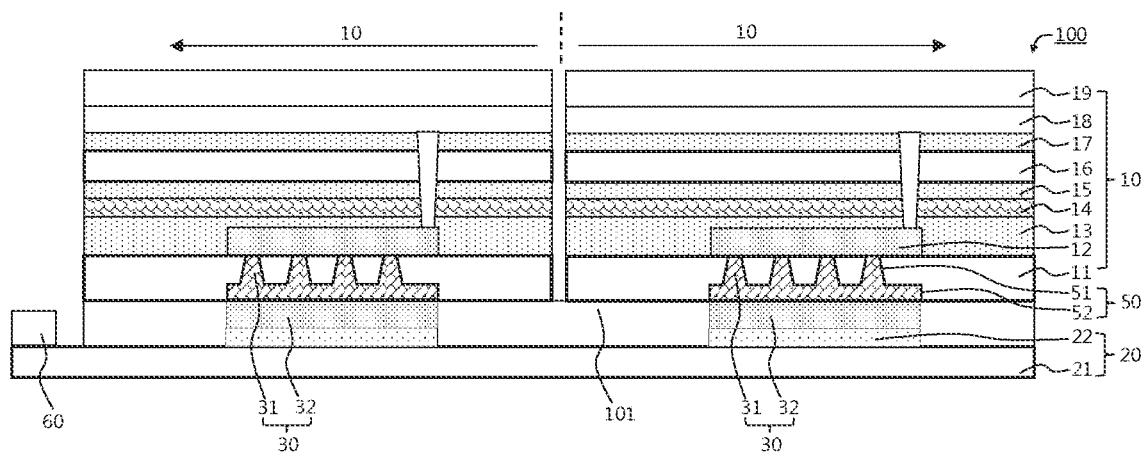
FIG. 2 illustrates a schematic diagram of a splicing state of a display panel provided by an embodiment of the present disclosure.

Please refer to FIG. 1, FIG. 2, FIG. 3(*a*), FIG. 3(*b*), and FIG. 3 (*c*). FIG. 1 illustrates a first schematic diagram of a display panel 100 provided by an embodiment of the present disclosure. FIG. 2 illustrates a schematic diagram of a splicing state of a display panel 100 provided by an embodiment of the present disclosure. FIG. 3(*a*) illustrates a schematic diagram of various top-view shapes of a sub via 51 provided by an embodiment of the present disclosure. FIG. 3(*b*) illustrates a schematic cross-sectional view of the sub via 51 provided by an embodiment of the present disclosure when there is no groove 52. FIG. 3(*c*) illustrates a schematic cross-sectional view of the sub via 51 provided by an embodiment of the present disclosure when there is a groove 52.

The embodiment of the present disclosure provides the display panel 100. The display panel 100 includes: at least one display component 10, a driving substrate 20, and a conductive member 30. The at least one display component 10 includes a first substrate 11, at least one first terminal 12 disposed on the first substrate 11, and a light-emitting layer 19. The light-emitting layer 19 is electrically connected to the at least one first terminal 12. The driving substrate 20 includes a driving chip 60, a second substrate 21, and a plurality of second terminals 22 disposed on the second substrate 21. The at least one display component 10 is disposed on the driving substrate 20. An orthographic projection of the at least one first terminal 12 on the driving substrate 20 at least partially overlaps with an orthographic projection of a corresponding one of the second terminals 22 on the driving substrate 20. The driving chip 60 is electrically connected to the second terminals 22. The driving chip 60 is configured to transmit a signal to the at least one first terminal 12 through the corresponding one of the second terminals 22 to drive the light-emitting layer 19 for display. The conductive member 30 is electrically connected between the at least one first terminal 12 and the corresponding one of the second terminals 22. The at least one display component 10 includes at least one via group 50. The at least one via group 50 is disposed between the at least one first terminal 12 and the corresponding one of the second terminals 22. Each of the at least one via group 50 includes a groove 52 and a plurality of sub vias 51. The groove 52 is located on a surface of the first substrate 11 toward the driving substrate 20. The sub vias 51 penetrate a surface of the first substrate 11 away from the groove 52. The sub vias 51 are connected between the at least one first terminal 12 and the groove 52. An orthographic projection of the groove 52 on the driving substrate 20 covers orthographic projections of the sub vias 51 on the driving substrate 20. The conductive member 30 is filled at least in the groove 52 and the sub vias 51.

Specifically, as shown in an example in FIG. 2, two display components 10 are spliced and disposed on the driving substrate 20. A length of the driving substrate 20 is equal to or greater than a sum of lengths of a plurality of display components 10 disposed on the driving substrate 20. A width of the driving substrate 20 is equal to or greater than a sum of widths of the plurality of display components 10 disposed on the driving substrate 20. As such, the display components 10 can be driven and supplied with electrical signals through one driving substrate 20.

Specifically, the display components 10 can be organic light-emitting display components or small pieces of organic light-emitting display panels (small-size OLEDs). At least two display components 10 are spliced and disposed on the driving substrate 20 to form a large-size display panel.

Specifically, those skilled in the art can easily understand that when the display components 10 are organic light-emitting display components, each of the display components 10 includes an array functional layer 18 and a light-emitting layer 19 disposed on the array functional layer 18. The light-emitting layer 19 can be an organic light-emitting functional layer. The light-emitting layer 19 can include a red light-emitting device, a green light-emitting device, and a blue light-emitting device and is not repeated herein.

Specifically, those skilled in the art can easily understand that the array functional layer 18 can include a plurality of thin film transistors disposed in an array, scan lines, data lines, and other structures and is not repeated herein.

Specifically, those skilled in the art can easily understand that each of the display components can further include other structures and components for realizing display and improving each of the display components 10. For example, each of the display components can further include an encapsulation layer disposed on the light-emitting layer 19 and is not repeated herein.

Specifically, each of the display components includes the at least one first terminal 12 disposed on the first substrate 11. The light-emitting layer 19 is electrically connected to the at least one first terminal 12. The driving substrate 20 includes the second terminals 22 disposed on the second substrate 21. The at least one first terminal 12 and the corresponding one of the second terminals 22 are electrically connected through the conductive member 30, so that an electrical signal on the driving substrate can sequentially pass the corresponding one of second terminals 22, the conductive member 30, and the at least one first terminal 12 to reach the array functional layer 18.

Specifically, each of the first terminals 12 of each of the display components 10 can include a first sub terminal, a second sub terminal and so on. The first sub terminal can be electrically connected to one of the scan lines on each of the display components 10, and the second sub terminal can be electrically connected to one of the data lines on each of the display components 10. Each of the display components 10 includes a plurality of first terminals 12. Each of the first terminals 12 is electrically connected to a corresponding electrode or wiring on each of the display components 10.

Specifically, the drive substrate 20 can include a scan bus and a data bus. The driving substrate 20 can include third sub terminals, fourth sub terminals and so on. The scan bus is electrically connected to the third sub terminals, and the data bus is electrically connected to the fourth sub terminals. The scan bus is electrically connected to the corresponding scan lines on each of the display components 10 through the third sub terminals, the conductive member 30, and the first sub terminal. The data bus is electrically connected to the corresponding data lines on each of the display components 10 through the fourth sub terminals, the conductive member 30, and the second sub terminals. One or more frame parts of the drive substrate 20 can be electrically connected to the driving chip 60, a flexible circuit board and so on. As such, the driving chip 60 and the flexible circuit board can provide a corresponding electrical signal to each of the display components 10 to drive the display components 10 to display an image.

Specifically, the display components 10 are spliced and disposed on the driving substrate 20. The driving is realized by penetrating the at least one via group 50 of the first substrate 11, which can reduce a splicing seam between adjacent display components 10 to realize seamless splice and improve image display quality of the display panel 100.

It should be noted that multiple display components 10 are spliced and disposed on the driving substrate 20 in the example. However, one display component 10 can be disposed on the driving substrate 20, which can realize a narrow frame function.

Specifically, each of the at least one via group 50 includes a groove 52 and a plurality of sub vias 51. The groove 52 is located on a side surface of the first substrate 11 toward the driving substrate 20. The sub vias 51 penetrate a surface of the first substrate 11 away from the groove 52. The sub vias 51 are connected between the at least one first terminal 12 and the groove 52. Furthermore, the groove 52 is configured to reduce a thickness of the first substrate 11. The groove 52 is disposed on the surface of the first substrate 11 toward the driving substrate 20. The sub vias 51 penetrate parts of the first substrate 11 which are thinned by the groove 52.

Specifically, an orthographic projection of the groove 52 on the driving substrate 20 covers orthographic projections of the sub vias 51 on the driving substrate 20. That is, the sub vias 51 are located within a range of the groove 52.

Specifically, each of the at least one via group 50 includes the groove 52 and the sub vias 51. The groove 52 and the sub vias 51 penetrate the first substrate 11 as a whole. The conductive member 30 is at least filled in the groove 52 and the sub vias. The at least one first terminal 12 is electrically connected to a corresponding one of the second terminals 22 through the conductive member 30. The at least one first terminal 12 and the corresponding one of second terminals 22 are electrically connected through the conductive member 30 in the groove 52 and the sub vias 51.

Specifically, it is assumed that only one integral via is disposed between the at least one first terminal 12 and the corresponding one of the second terminals 22, laser energy fluctuates when the integral via is formed by a laser drilling process. Since a thickness of the first substrate 11 is relatively large and a thickness of the at least one first terminal 12 is relatively small, a situation that the integral via penetrates the at least one first terminal 12 easily occurs. Accordingly, the electrical connection between each of the display components 10 and the driving substrate 20 is poor, and a yield rate of the splicing the display components is decreased.

Figure 3A:
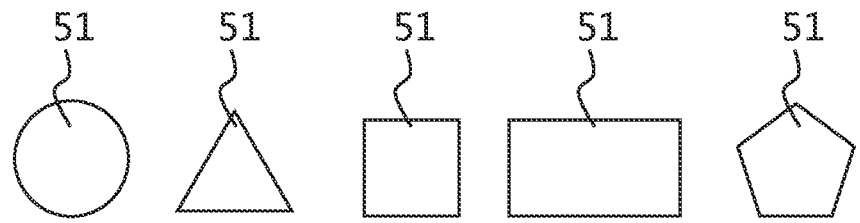
FIG. 3(a) illustrates a schematic diagram of various top-view shapes of a sub via provided by an embodiment of the present disclosure.
Figure 3B:
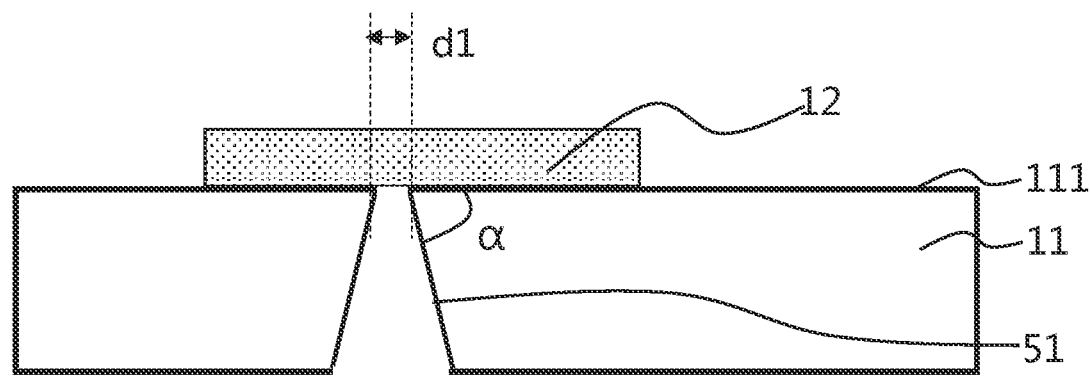
FIG. 3(b) illustrates a schematic cross-sectional view of the sub via provided by an embodiment of the present disclosure when there is no groove.

Specifically, as shown in FIG. 3(b), when the groove 52 is not disposed on the first substrate 11 and the sub via 51 is directly disposed, an included angle between the sub via 51 and a surface 111 of the first substrate 11 close to the at least one first terminal 12 is smaller because the thickness of the first substrate 11 is relatively large. A width d1 with which the sub via 51 contacts the at least one first terminal 12 is smaller. This results in an insufficient contact area between the conductive member 30 and the at least one first terminal 12, so that poor contact occurs.

Figure 3C:
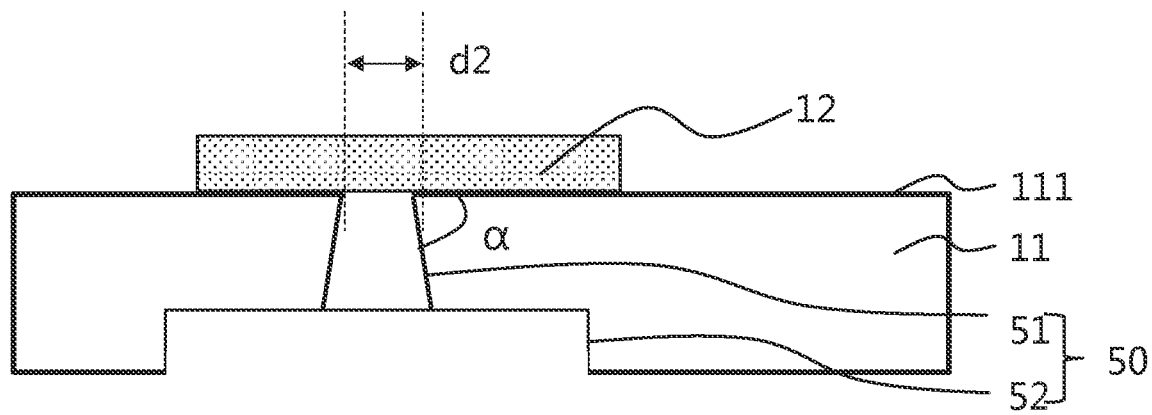
FIG. 3(c) illustrates a schematic cross-sectional view of the sub via provided by an embodiment of the present disclosure when there is a groove.

Specifically, as shown in FIG. 3(c), in the present embodiment, when the groove 52 is first disposed on the first substrate 11, the groove 52 thins the first substrate 11, and then the sub via 51 is disposed on the first substrate 11. Since a thickness of a par of disposing the sub via 51 on the first substrate 11 is smaller, an included angle between the sub via 51 and a surface 111 of the first substrate 11 close to the at least one first terminal 12 is larger. A width d2 with which the sub via 51 contacts the at least one first terminal 12 is larger. Accordingly, a contact area between the conductive member 30 and the at least one first terminal 12 is increased, thereby increasing contact between the conductive member 30 and the at least one first terminal 12.

Specifically, in the present embodiment, each of the at least one via group 50 includes multiple sub vias 51. The sub vias 51 of each of the at least one via group 50 are formed by the laser drilling process. The conductive member 30 can be electrically connected to the at least one first terminal 12 through side surfaces of the sub vias 51, which penetrate the at least one first terminal 12 (as shown in the following subsequent embodiment), even if laser energy fluctuates and the sub vias 51 penetrate the at least one first terminal 12. Side contact surfaces of the sub vias 51 are increased, so that poor electrical connection between each of the display components 10 and the driving substrate 20 can be avoided to increase a splicing yield rate of the display components. Furthermore, a process window (a stability range or a process margin) in the laser drilling process can be increased to increase a yield rate of the drilling process.

Specifically, furthermore, in the present embodiment, the groove 52 is first disposed to thin the first substrate 11, and then the sub vias 51 are disposed. The width d2 with which each of the sub vias 51 contacts the at least one first terminal 12 is larger. Accordingly, the contact area between the conductive member 30 and the at least one first terminal 12 is increased, thereby increasing the contact between the conductive member 30 and the at least one first terminal 12.

In some embodiments, in a direction parallel to the surface of the first substrate 11, the sub vias 51 are disposed side by side.

Specifically, in the direction parallel to the surface of the first substrate 11, the sub vias 51 in each of the at least one via group 50 are disposed side by side.

More specifically, in a direction parallel to the surface of the first substrate 11, the sub vias 51 in each of the at least one via group 50 are disposed in parallel.

In some embodiments, a distance between the surface of the first substrate 11 away from the groove 52 and the groove 52 is ranged from 1 μm to 3 μm.

Specifically, the groove 52 thins the first substrate 11, and a remaining part of the first substrate 11 has a thickness of 1 μm to 3 μm. When the sub vias 51 are formed, the width d2 with which each of the sub vias 51 contacts the at least one first terminal 12 is larger. Accordingly, the contact area between the conductive member 30 and the at least one first terminal 12 is increased, thereby increasing the contact between the conductive member 30 and the at least one first terminal 12.

In some embodiments, in the direction parallel to the surface of the first substrate 11, a length of each of the sub vias 51 is ranged from 3 μm to 30 μm.

Specifically, in the direction parallel to the surface of the first substrate 11, the length of each of the at least one first terminal 12 can be ranged from 3 μm to 100 μm. The length of each of the sub vias 51 is set to be 3 μm to 30 μm, so that multiple sub vias 51 can be disposed corresponding to the at least one first terminal 12.

In some embodiments, in the direction parallel to the surface of the first substrate 11, a distance between two adjacent ones of the sub vias 51 is ranged from 5 μm to 20 μm.

Specifically, the sub vias 51 penetrate the first substrate 11. A material of the first substrate 11 is located between the two adjacent ones of the sub vias 51. In the direction parallel to the surface of the first substrate 11, a width of the material of the substrate 11 between the two adjacent ones of the sub vias is ranged from 5 μm to 20 μm. This can ensure that the material of the substrate 11 between the two adjacent ones of the sub vias 51 does fall off, and appropriate number of the sub vias 51 can be disposed.

In some embodiments, as shown in FIG. 3(a), a shape of an orthographic projection of each of the sub vias 51 on the first substrate 11 includes at least one of a circle, a triangle, a rectangle, a diamond, and a polygon.

Specifically, the shape of the orthographic projection of each of the sub vias 51 on the first substrate 11 includes at least one of a circle, a triangle, a rectangle, a diamond, and a polygon. That is, the shape of the orthographic projection of each of the sub vias 51 on the surface of the first substrate 11 away from the groove 52 includes at least one of a circle, a triangle, a rectangle, a diamond, and a polygon.

Specifically, on the surface of the first substrate 11 close to the groove 52, a shape of each of the sub vias 51 can be disposed according to requirements, for example, according to a size and a of the at least one first terminal 12, so as to provide the sub vias 51 as many as possible.

In some embodiments, the conductive member 30 includes a first sub conductive member 31 and a second sub conductive member 32. The first sub conductive member 31 is filled in the groove 52 and the sub vias 51, and the second sub conductive member 31 is connected between the first sub conductive member 31 and the corresponding one of the second terminals 22.

Specifically, in some embodiments, since multiple film structures are disposed on the driving substrate 20, the corresponding one of the second terminals 22 cannot directly contact the first sub conductive member 31. Accordingly, the second sub conductive member 32 is disposed and connected between the first sub conductive member 31 and the corresponding one of the second terminals 22 to implement a good connection between the at least one first terminal 12 and the corresponding one of the second terminals.

Specifically, the second sub conductive member 32 is disposed between the first sub conductive member 31 or the first substrate 11 and the corresponding one of the second terminals 22, so that the at least one first terminal 12 and the corresponding one of the second terminals 22 can be closely connected.

Specifically, materials of the first conductive member 31 and the second conductive member 32 can be the same and can be manufactured in the same process to simplify the manufacturing process.

Specifically, materials of the first conductive member 31 and the second conductive member 32 can be different. For example, the first conductive member 31 is filled in the groove 52 and the sub vias 51, and thus the material of the first conductive member 31 needs good fluidity. The second sub conductive member 32 does not need to be disposed in the sub vias 51. Compared with the material of the first sub conductive member 31, fluidity of the material of the second sub conductive member 32 can be reduced. The materials of the first conductive member 31 and the second conductive member 32 can be different, and thus a selection range of the material of the second conductive member 32 can be increased.

In some embodiments, the display panel 100 further includes an adhesion layer 101. The adhesion layer 101 is disposed between the first substrate 11 and the driving substrate 20.

Specifically, the adhesion layer 101 can be various types of adhesive layers, such as optical adhesive OCR and can be formed by a glue filling process through capillary penetration effect or a pinhole injection scheme for glue injection process.

Specifically, the adhesive layer 101 is configured to fix each of the at least one display component 10 on the driving substrate 20 to prevent each of the at least one display component 10 from loosening and to prevent the connection between the at least one first terminal 12 and the corresponding one of the second terminals 22 from falling off, thereby increasing the yield rate and the display performance of the display panel.

In the embodiment of the present disclosure, each of the at least one via group 50 includes multiple sub vias 51. The sub vias 51 of each of the at least one via group 50 are formed by a laser drilling process. The conductive member 30 can be electrically connected to the at least one first terminal 12 through side surfaces of the sub vias 51, which penetrate the at least one first terminal 12 (as shown in the following subsequent embodiment), even if laser energy fluctuates and the sub vias 51 penetrate the at least one first terminal 12. Side contact surfaces of the sub vias 51 are increased, so that poor electrical connection between each of the display components 10 and the driving substrate 20 can be avoided to increase a splicing yield rate of the display components. Furthermore, a process window (a stability range or a process margin) of the laser drilling process can be increased to increase a yield rate of the drilling process.

Second Embodiment

A display panel in the present embodiment is the same as or similar to the display panel in the above-mentioned embodiment except that the sub vias 51 further extend into the at least one first terminal 12.

Figure 4:
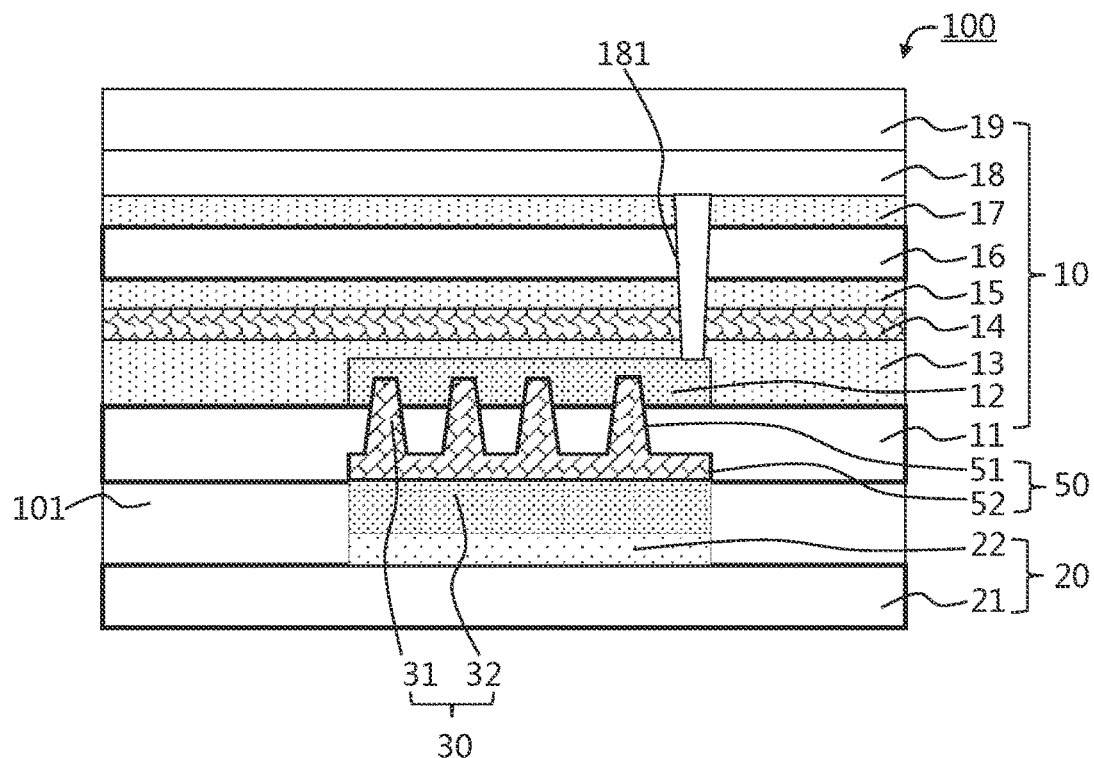
FIG. 4 illustrates a second schematic diagram of a display panel provided by an embodiment of the present disclosure.

Please refer to FIG. 4. FIG. 4 illustrates a second schematic diagram of a display panel 100 provided by an embodiment of the present disclosure.

The embodiment of the present disclosure provides the display panel 100. Compared with the first embodiment, the sub vias 51 further extend into the at least one first terminal 12.

Specifically, when the vias 51 are formed by a laser, the vias 51 further extend into the at least one first terminal 12.

Specifically, when the first sub conductive member 31 is formed in the sub vias 51, the first sub conductive member 31 is further filled in parts of the sub vias 51 which extend into the at least one first terminal 12.

In the embodiment of the present disclosure, the arrangement of the at least one via group 50 also has the beneficial effect of the first embodiment.

In the embodiment of the present disclosure, compared to the first embodiment, the sub vias 51 further extend to the at least one first terminal 12, and the first sub conductive member 31 is further filled in the parts of the sub vias 51 which extend into the at least one first terminal 12. At this time, side contact and side conduction between the conductive member 30 and the at least one first terminal 12 are increased, and an conductive area between the conductive member 30 and the at least one first terminal 12 is increased, thereby improving conductive performance and contact tightness between the conductive member 30 and the at least one first terminal 12.

In the embodiment of the present disclosure, each of the at least one via group 50 includes multiple sub vias 51. The sub vias 51 of each of the at least one via group 50 are formed by a laser drilling process. The conductive member 30 can be electrically connected to the at least one first terminal 12 through side surfaces of the sub vias 51, which penetrate the at least one first terminal 12 (as shown in the following subsequent embodiment), even if laser energy fluctuates and the sub vias 51 penetrate the at least one first terminal 12. Side contact surfaces of the sub vias 51 are increased, so that poor electrical connection between each of the display components 10 and the driving substrate 20 can be avoided to increase a splicing yield rate of the display components. Furthermore, a process window (a stability range or a process margin) in the laser drilling process can be increased to increase a yield rate of the drilling process.

Third Embodiment

A display panel in the present embodiment is the same as or similar to the display panel in any one of the above-mentioned embodiments except that the sub vias 51 further penetrate the at least one first terminal 12.

Figure 5:
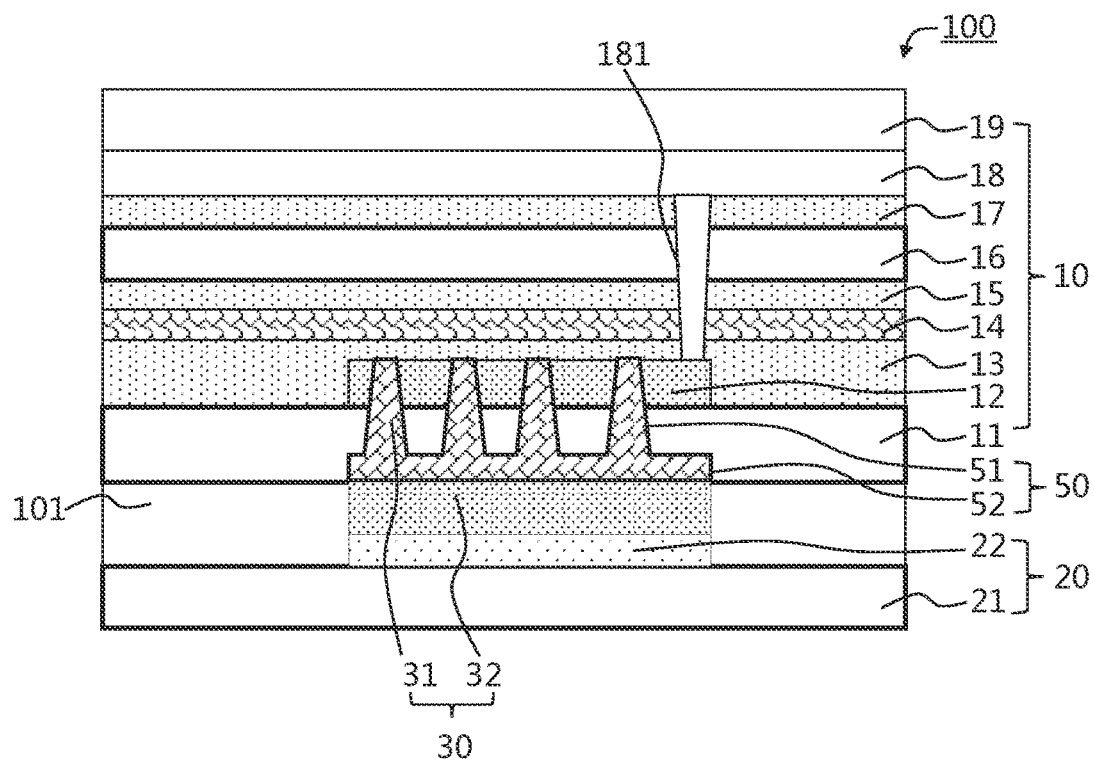
FIG. 5 illustrates a third schematic diagram of a display panel provided by an embodiment of the present disclosure.

Please refer to FIG. 5. FIG. 5 illustrates a third schematic diagram of a display panel 100 provided by an embodiment of the present disclosure.

In the embodiment of the present disclosure, when compared with the first and the second embodiments, the sub vias 51 further penetrate the at least one first terminal 12.

Specifically, in some implementations, a size and a thickness of the at least one first terminal 12 are small. When the sub vias 51 do not penetrate the at least one first terminal 12, a contact area between the at least one first terminal 12 and a side surface of the conductive member 30 is not big enough.

Specifically, when the sub vias 51 further penetrate the at least one first terminal 12, the contact area between the at least one first terminal 12 and the side surface of the conductive member 30 is larger.

In the embodiment of the present disclosure, when compared to the second embodiment, the sub vias 51 further penetrate the at least one first terminal 12. Accordingly, the side contact area between the at least one first terminal 12 and the side surface of the conductive member 30 is further increased, thereby improving conductive performance and contact tightness between the conductive member 30 and the at least one first terminal 12 and having the beneficial effect of the above-mentioned embodiment.

Four Embodiment

A display panel in the present embodiment is the same as or similar to the display panel in the above-mentioned embodiments except that the at least one display component further includes a third substrate 16.

In some embodiments, please continue to refer to FIG. 1, FIG. 4, and FIG. 5. The at least one display component further includes the third substrate 16 and a connection hole 181 penetrating the third substrate 16. The at least one first terminal 12 is disposed between the first substrate 11 and the third substrate 16. The light-emitting layer 19 is disposed on the third substrate 16. The light-emitting layer 19 is electrically connected to the at least one first terminal 12 through the connection hole 181.

Specifically, the at least one display component 10 includes the first substrate 11 and the third substrate 16. The first substrate 11 and the third substrate 16 which are stacked can better prevent intrusion of moisture and improve life and performance of the at least one display component 10.

Specifically, the at least one first terminal 12 is disposed between the first substrate 11 and the third substrate 16 to prevent, when the sub vias 51 are formed, the film layer structure on the third substrate 16, such as the light-emitting layer 19, from being damaged, thereby improving the life and the performance of the at least one display component 10.

In some embodiments, the at least one display component 10 further includes a barrier layer 14. The barrier layer 14 is configured to block ultraviolet light. The barrier layer 14 is disposed at a side of the at least one first terminal 12 away from the first substrate 11.

Specifically, the barrier layer 14 can reflect, absorb, or block a laser in a range of the ultraviolet wavelength. When the sub vias 51 are formed, the laser irradiates from a side of the first substrate 11 away from the at least one first terminal 12. The barrier layer 14 can block the laser from continuing to irradiate the third substrate 16 or the array functional layer 18 to prevent, when the sub vias 51 are formed, the film layer structure on the third substrate 16, such as the array functional layer 18, from being damaged, thereby improving the life and the performance of the at least one display component 10.

In some embodiments, the at least one display component 10 further includes a first insulating layer 13. The first insulating layer 13 is disposed between the barrier layer 14 and the at least one first terminal 12. A material of the first insulating layer 13 includes an inorganic material.

Specifically, the first insulating layer 13 has a function of isolating heat conduction during laser irradiation. Furthermore, the first insulating layer 13 can increase adhesion between the first substrate 11 and the third substrate 16, so that bonding between the first substrate 11 and the third substrate 16 can be more, and reliability of the at least one display component 10 is improved.

Specifically, the material of the first insulating layer 13 can include but is not limited to silicon nitride or silicon oxide.

In some embodiments, a material of the barrier layer 14 includes at least one of an opaque metal layer and amorphous silicon.

Specifically, the material of the barrier layer 14 needs to be able to block or absorb the laser in the range of the ultraviolet wavelength. The opaque metal can block the laser. The amorphous silicon can absorb the laser to prevent, when the sub vias 51 are formed, the film layer structure on the third substrate 16, such as the array functional layer 18, from being damaged, thereby improving the life and the performance of the at least one display component 10.

Specifically, the material of the barrier layer 14 can be a-Si (amorphous silicon), a composite film of a-Si (amorphous silicon) and SiOx (silicon nitride), a material which is coated by coating, resistant to a high temperature, and can block the ultraviolet light, such as an organic film layer or a composite film layer of an organic film layer and an inorganic film layer, or a metal layer. When the barrier layer 14 is a non-conductive material, the barrier layer 14 can be not patterned. When the barrier layer 14 is a conductive material, the barrier layer 14 is preferably patterned. Only the material at a part of the barrier layer 14 corresponding to the at least one first terminal 12 is left, and the material at other parts of the barrier layer 14 is removed by etching or the like.

It should be noted that in the at least one display component 10 in the above-mentioned embodiments, a second insulating layer 15 can be further disposed between the barrier layer 14 and the third substrate 16, and a third insulating layer 17 can further be disposed between the third substrate 16 and the array functional layer 18. A material of each of the second insulating layer 15 and the third insulating layer 17 can include but is not limited to silicon nitride or silicon oxide. The third insulating layer 17 can be a buffer layer.

Fifth Embodiment

An embodiment of the present disclosure provides a method for manufacturing a display panel. The display panel in any one of the above-mentioned embodiments can be manufactured by the method for manufacturing the display panel in the embodiment of the present disclosure.

Figure 6:
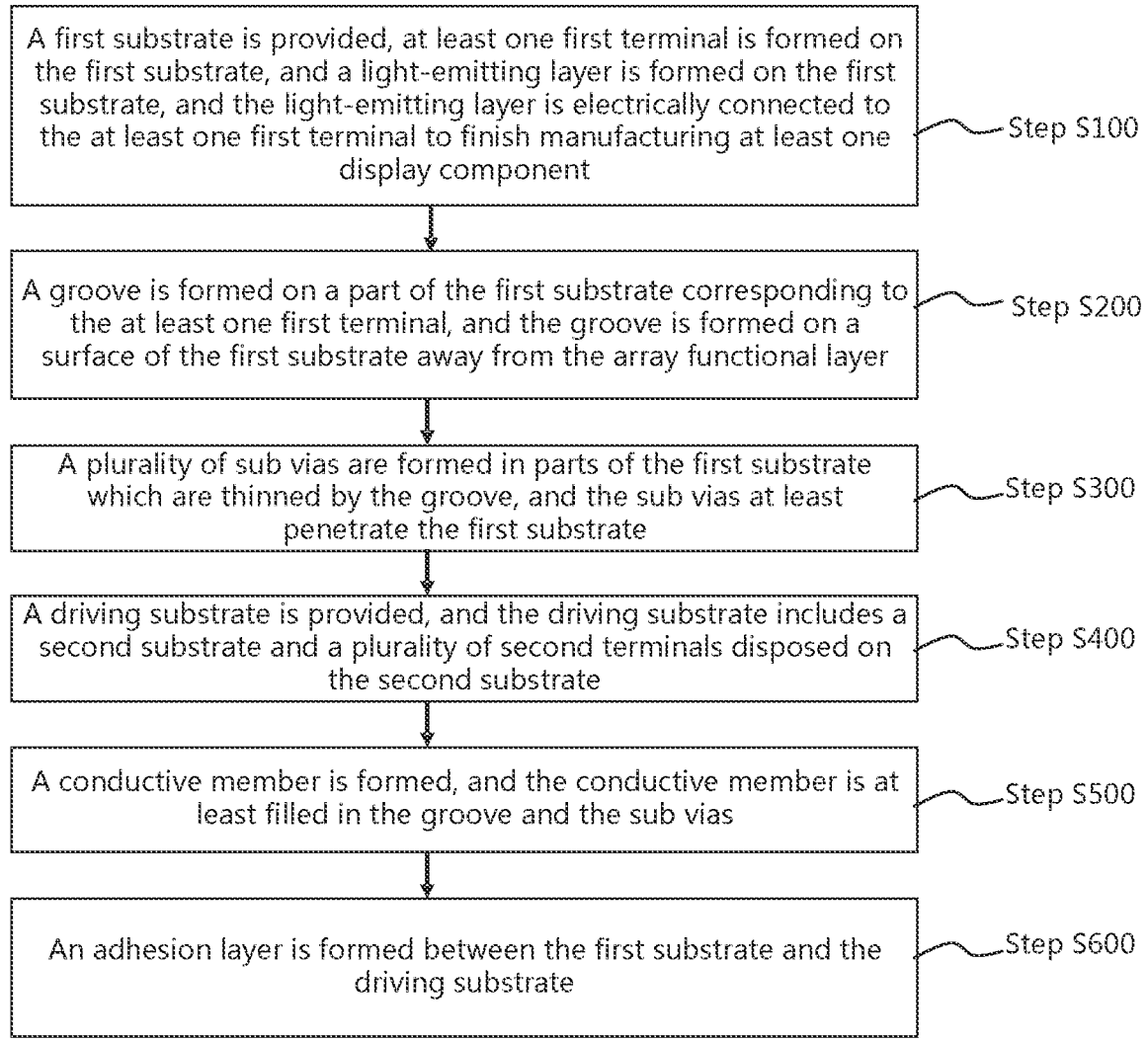
FIG. 6 illustrates a first flowchart of a method for manufacturing a display panel provided by an embodiment of the present disclosure.
Figure 7:
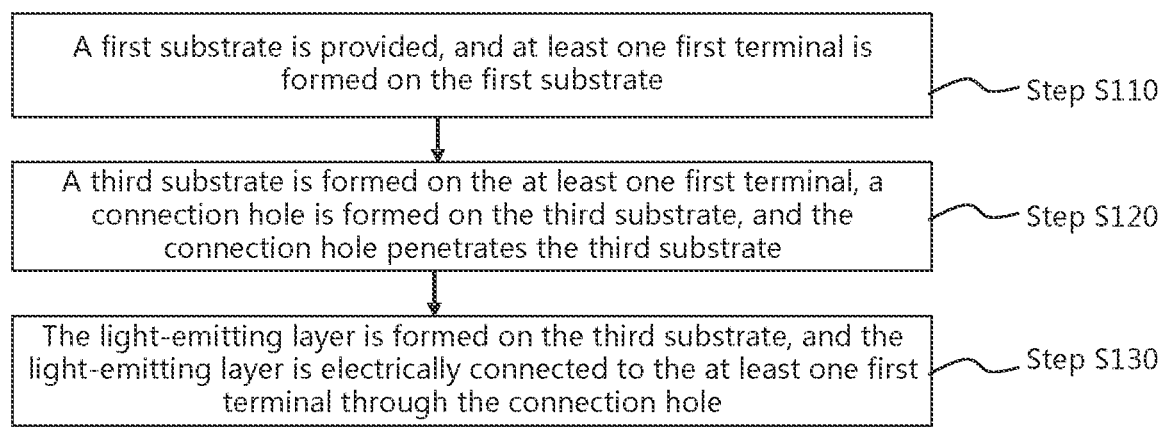
FIG. 7 illustrates a second flowchart of a method for manufacturing a display panel provided by an embodiment of the present disclosure.
Figure 8:
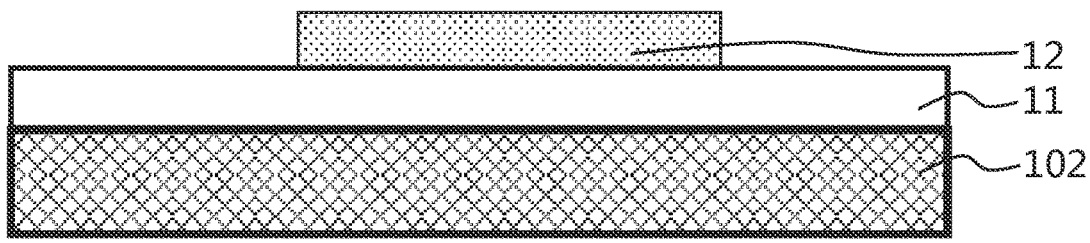
FIG. 8 illustrates a schematic diagram of forming a first terminal in the method for manufacturing the display panel provided by an embodiment of the present disclosure.
Figure 9:
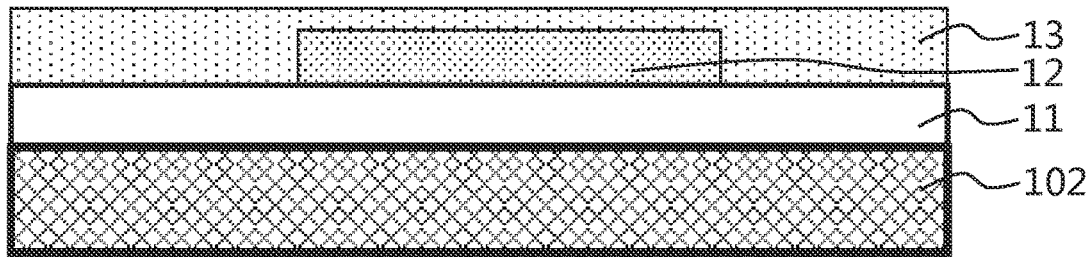
FIG. 9 illustrates a schematic diagram of forming a first insulating layer in the method for manufacturing the display panel provided by an embodiment of the present disclosure.
Figure 10:
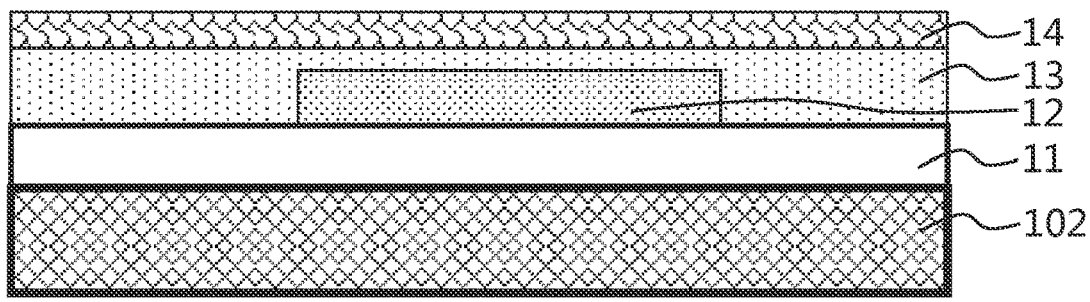
FIG. 10 illustrates a schematic diagram of forming a barrier layer in the method for manufacturing the display panel provided by an embodiment of the present disclosure.
Figure 11:
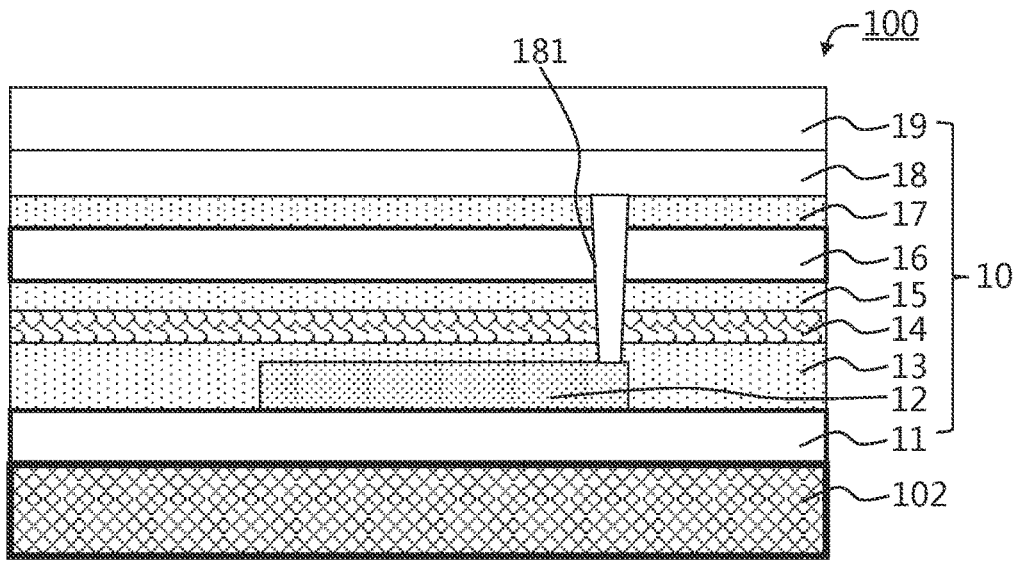
FIG. 11 illustrates a schematic diagram of forming a light-emitting layer in the method for manufacturing the display panel provided by an embodiment of the present disclosure.
Figure 12A:
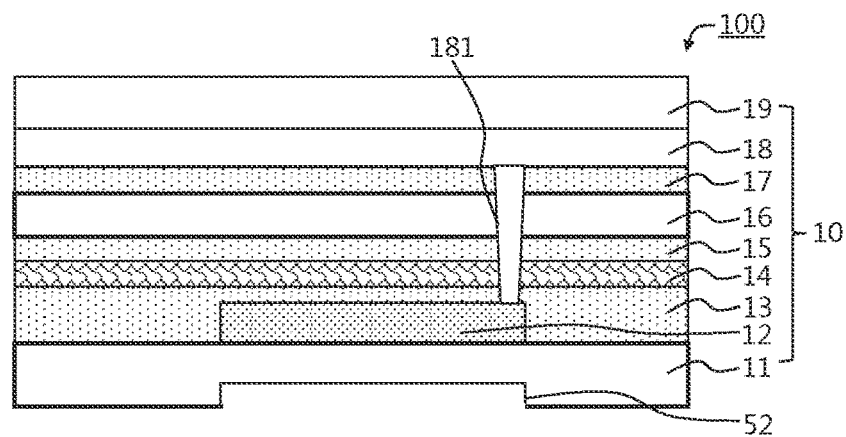
FIG. 12(a) illustrates a first schematic diagram of forming a via group in the method for manufacturing the display panel provided by an embodiment of the present disclosure.
Figure 12B:
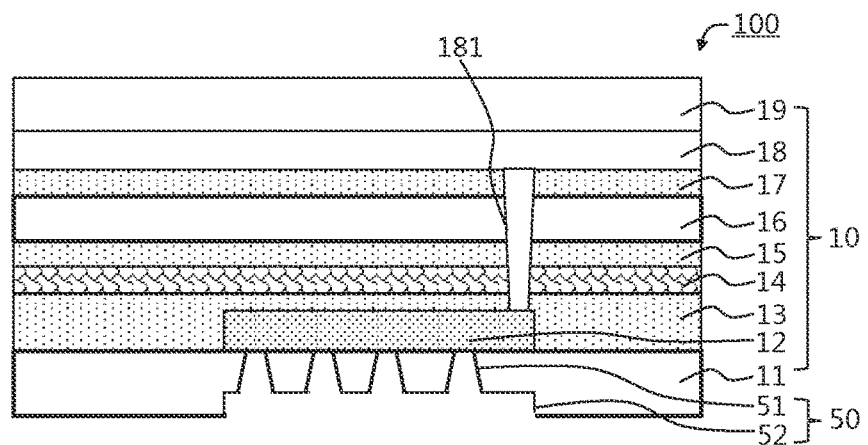
FIG. 12(b) illustrates a second schematic diagram of forming a via group in the method for manufacturing the display panel provided by an embodiment of the present disclosure.
Figure 13:
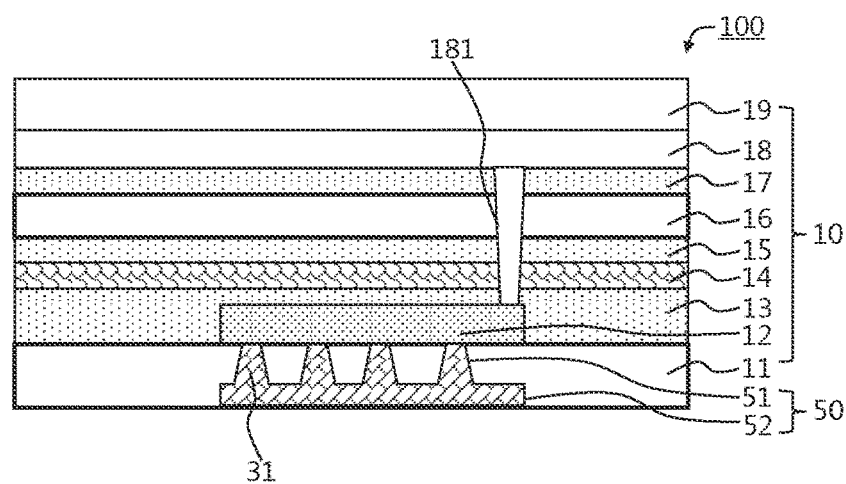
FIG. 13 illustrates a schematic diagram of forming a first conductive member in the method for manufacturing the display panel provided by an embodiment of the present disclosure.
Figure 14:
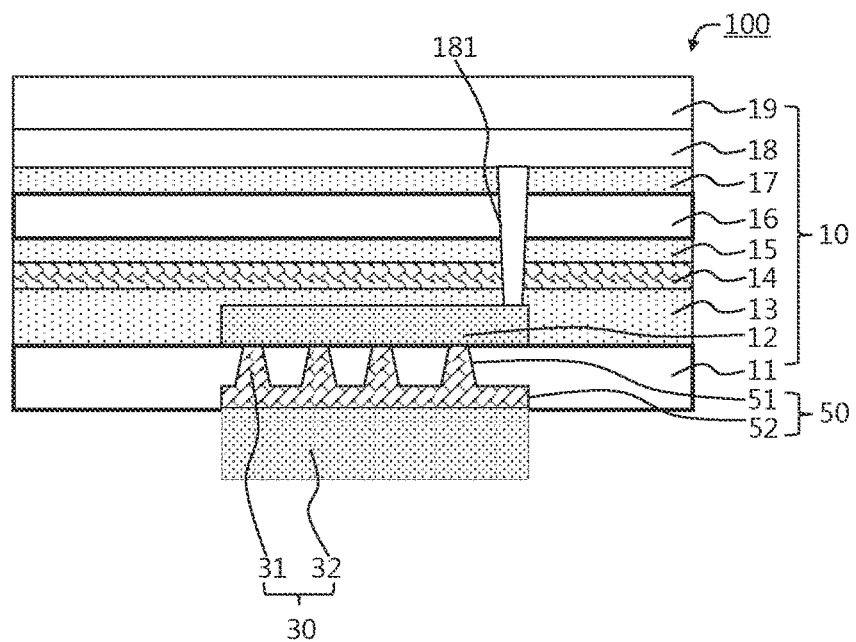
FIG. 14 illustrates a schematic diagram of forming a second conductive member in the method for manufacturing the display panel provided by an embodiment of the present disclosure.
Figure 15:
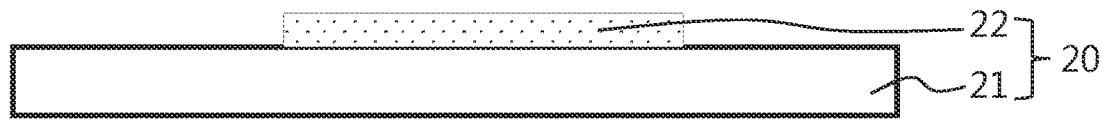
FIG. 15 illustrates a schematic diagram of providing a driving substrate in the method for manufacturing the display panel provided by an embodiment of the present disclosure.
Figure 16:
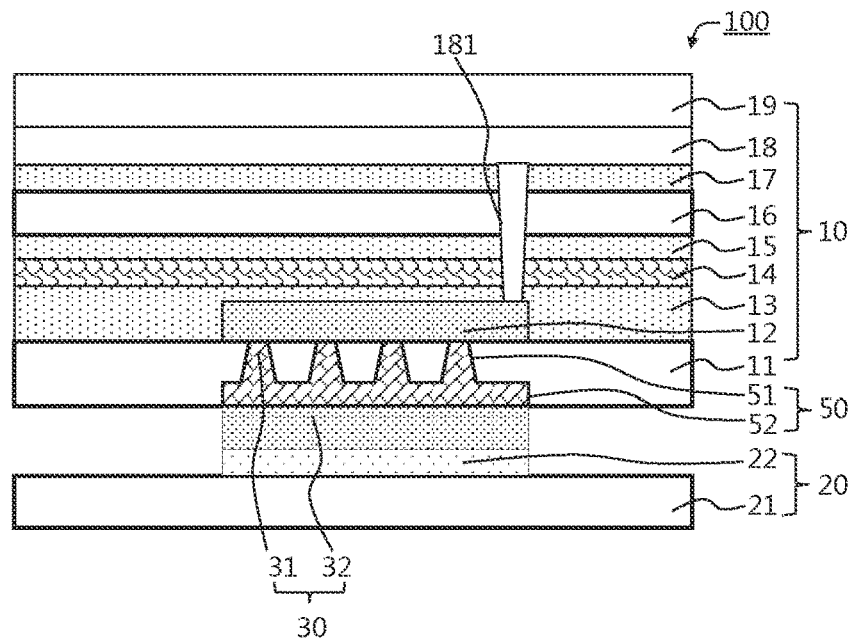
FIG. 16 illustrates a schematic diagram of an alignment connection of a display component and a driving substrate in the method for manufacturing method of the display panel provided by the embodiment of the present disclosure.
Figure 17:
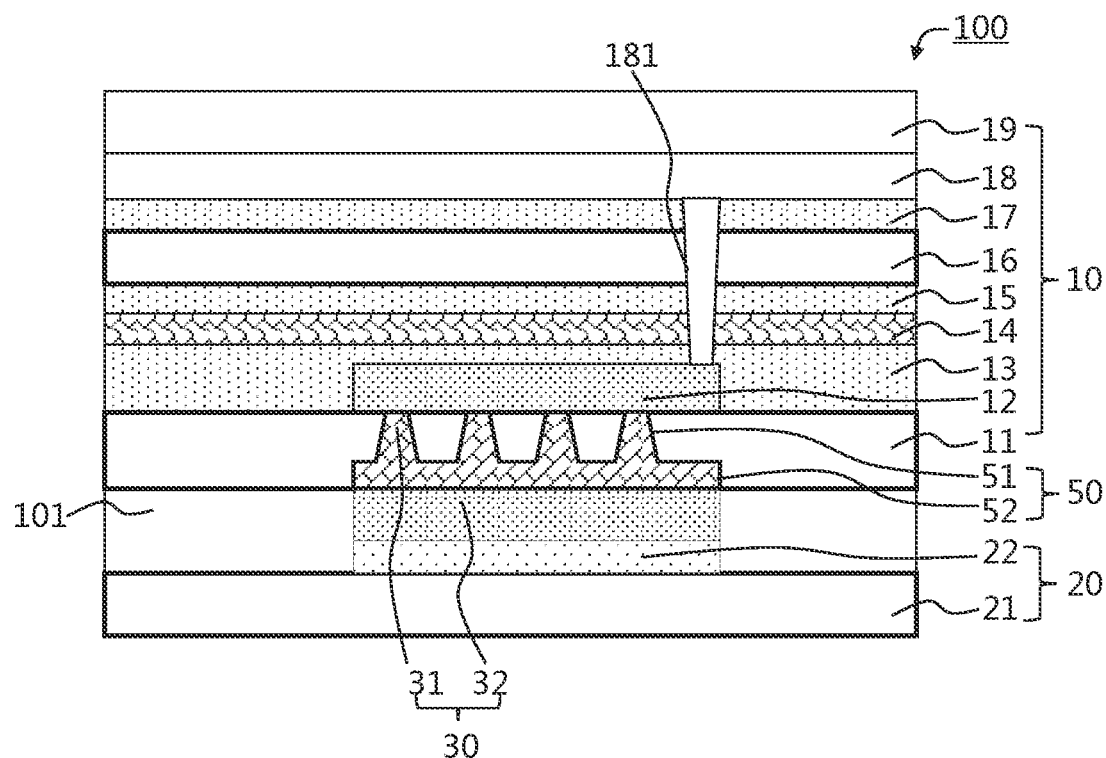
FIG. 17 illustrates a schematic diagram of forming an adhesion layer in the method for manufacturing the display panel provided by an embodiment of the present disclosure.

Please refer to FIG. 6, FIG. 7, FIG. 8, FIG. 9, FIG. 10, FIG. 11, FIG. 12, FIG. 13, FIG. 14, FIG. 15, FIG. 16, and FIG. 17. FIG. 6 illustrates a first flowchart of a method for manufacturing a display panel provided by an embodiment of the present disclosure. FIG. 7 illustrates a second flowchart of a method for manufacturing a display panel provided by an embodiment of the present disclosure. FIG. 8 illustrates a schematic diagram of forming a first terminal 12 in the method for manufacturing the display panel provided by an embodiment of the present disclosure. FIG. 9 illustrates a schematic diagram of forming a first insulating layer 13 in the method for manufacturing the display panel provided by an embodiment of the present disclosure. FIG. 10 illustrates a schematic diagram of forming a barrier layer 14 in the method for manufacturing the display panel provided by an embodiment of the present disclosure. FIG. 11 illustrates a schematic diagram of forming a light-emitting layer 19 in the method for manufacturing the display panel provided by an embodiment of the present disclosure. FIG. 12($a$) illustrates a first schematic diagram of forming a via group 50 in the method for manufacturing the display panel provided by an embodiment of the present disclosure. FIG. 12($b$) illustrates a second schematic diagram of forming a via group 50 in the method for manufacturing the display panel provided by an embodiment of the present disclosure. FIG. 13 illustrates a schematic diagram of forming a first conductive member 31 in the method for manufacturing the display panel provided by an embodiment of the present disclosure. FIG. 14 illustrates a schematic diagram of forming a second conductive member 32 in the method for manufacturing the display panel provided by an embodiment of the present disclosure. FIG. 15 illustrates a schematic diagram of providing a driving substrate 20 in the method for manufacturing the display panel provided by an embodiment of the present disclosure. FIG. 16 illustrates a schematic diagram of an alignment connection of a display component 10 and a driving substrate 20 in the method for manufacturing method of the display panel provided by the embodiment of the present disclosure. FIG. 17 illustrates a schematic diagram of forming an adhesion layer 101 in the method for manufacturing the display panel provided by an embodiment of the present disclosure.

The method for manufacturing the display panel 100 in the embodiment of the present disclosure includes the following steps: step S100, step S200, step S300, step S400, and step S500.

In step S100, a first substrate is provided, at least one first terminal is formed on the first substrate, and a light-emitting layer is formed on the first substrate, and the light-emitting layer is electrically connected to the at least one first terminal to finish manufacturing at least one display component.

As shown in FIG. 8, FIG. 9, FIG. 10, and FIG. 11, the first substrate 11 is provided, the at least one first terminal 12 is formed on the first substrate 11, and the light-emitting layer 19 is formed on the first substrate 11, and the light-emitting layer is electrically connected to the at least one first terminal 12 to finish manufacturing the at least one display component 10.

Specifically, when the at least one first display component 10 is formed, the at least one first terminal 12 is formed as shown in FIG. 8.

Specifically, when the at least one display component 10 is formed, the first insulating layer 13 can be selectively formed according to requirements as shown in FIG. 9.

Specifically, when the at least one display component 10 is formed, the barrier layer 14 can be selectively formed according to requirements as shown in FIG. 10.

Specifically, when the at least one display component 10 is formed, an array functional layer 18 and the light-emitting layer 19 are formed as shown in FIG. 11.

Specifically, the method for manufacturing the at least one display component 10 can further include steps of manufacturing other layer structures and components. For example, when the at least one display component 10 is an organic light-emitting display component, the at least one display component 10 can further include an encapsulation layer, and the manufacturing process of the at least one display component 10 can further include manufacturing a thin film encapsulation layer.

In step S200, a groove is formed on a part of the first substrate corresponding to the at least one first terminal, and the groove is formed on a surface of the first substrate away from the array functional layer.

In step S300, a plurality of sub vias are formed in parts of the first substrate which are thinned by the groove, and the sub vias at least penetrate the first substrate.

Specifically, as shown in FIG. 12(a), a laser is used for irradiating the corresponding part of the at least one first terminal 12 from a side of the first substrate 11 away from the at least one first terminal 12 to form the groove 52 on the first substrate 11.

Specifically, as shown in FIG. 12(b), the same or another laser then irradiates the surface of the first substrate 11 close to the groove 52 to form the plurality of sub vias 51. A groove 52 and a plurality of sub vias 51 corresponding to each of the at least one first terminal 12 constitute a via group 50. The via group 50 penetrates the first substrate 11.

Specifically, when the sub vias are 51 are formed, the sub vias 51 further extend into the at least one first terminal 12, or the sub vias 51 penetrate the at least one first terminal 12. The structure and the function of the sub vias 51 are described in the above-mentioned embodiments and not repeated herein.

It should be noted that as shown in FIG. 11 and FIG. 12(a), when the at least one display component 10 is a flexible display component, the first substrate 11 is a flexible substrate. For example, a material of the first substrate 11 is polyimide (PI). The first substrate 11 is formed on a rigid substrate 102. Before the via group 50 is formed, the method further includes peeling off the first substrate 11 or the at least one display component 10 from the rigid substrate 102.

In step S400, a driving substrate is provided, and the driving substrate includes a second substrate and a plurality of second terminals disposed on the second substrate.

Specifically, as shown in FIG. 15, a drive substrate 20 is provided. The driving substrate 20 at least includes the second substrate 21 and the second terminals 22. The structure and the function of the driving substrate 20 are described in the above-mentioned embodiments and not repeated herein.

In step S500, a conductive member is formed, and the conductive member is at least filled in the groove and the sub vias.

Specifically, as shown in FIG. 14, the conductive member 30 includes a first conductive member 31 and a second conductive member 32.

In some embodiments, the first conductive member 31 and the second conductive member 32 can be formed in different steps and processes. In some embodiments, the first conductive member 31 and the second conductive member 32 can be formed in the same step and processes.

A material of the first conductive member 31 or/and the second conductive member 32 include but is not limited to silver paste or anisotropic conductive adhesive (ACF).

A process of forming the first conductive member 31 or/and the second conductive member 32 includes screen printing or inkjet printing.

In step S600, the at least one display component is disposed on the driving substrate, and the at least one first terminal is electrically connected to the corresponding one of the second terminals through the conductive member.

Specifically, as shown in FIG. 16 and FIG. 2, the at least one display component 10 is disposed on the driving substrate 20, and the at least one first terminal 12 on the at least one display component 10 is electrically connected to the corresponding one of the second terminals on the driving substrate 20 through the conductive member 30.

Specifically, when multiple display components 10 are disposed on the driving substrate 20 and spliced, the method further includes aligning the display components 10 with the driving substrate 20 to arrange the display components 10 on a corresponding predetermined position on the driving substrate 20.

In some embodiments, as shown in FIG. 7, step S100 includes manufacturing steps: S110, S200, and S300.

In step S110, a first substrate is provided, and at least one first terminal is formed on the first substrate.

Specifically, as shown in FIG. 8, the first substrate 11 is provided, and at least one first terminal 12 is formed on the first substrate.

In step S120, a third substrate is formed on the at least one first terminal, a connection hole is formed on the third substrate, and the connection hole penetrates the third substrate.

Specifically, as shown in FIG. 10 and FIG. 11, the third substrate 16 is formed on the at least one first terminal 12, the connection hole 181 is formed on the third substrate 16, and the connection hole 181 penetrates the third substrate 16.

In step S130, the light-emitting layer is formed on the third substrate, and the light-emitting layer is electrically connected to the at least one first terminal through the connection hole 181.

Specifically, the array functional layer 18 and the light-emitting layer 19 are formed on the third substrate 16, and the array functional layer is electrically connected to the at least one first terminal 12 through the connection hole 181.

Specifically, the structure and the function of the array functional layer 18 are described in the above-mentioned embodiments and not repeated herein.

In the method for manufacturing the display panel in some embodiments, step S112 is further included between step S110 and step S120.

In step S112, a barrier layer is formed on the at least one first terminal, and the barrier layer can block ultraviolet light.

Specifically, as shown in FIG. 11, the material, the structure, and the function of the barrier layer 14 are described in the above-mentioned embodiments and are not repeated herein.

In some embodiments, in step S400, the method of forming the conductive member 30 includes: forming the conductive member 30 by at least one of screen printing, inkjet printing, and glue dispensing.

In the method for manufacturing the display panel in some embodiments, in step S400, the step of forming the conductive member includes steps: S410 and S420.

In step S410, a first sub conductive member 31 is formed, and the first sub conductive member 31 is filled in the groove 52 and the sub vias 51.

In step S420, a second sub conductive member 32 is formed on the first sub conductive member 31, the first sub conductive member 31 and the second sub conductive member 32 constitute the conductive member 30, and the second sub conductive member 322 is connected between the first sub conductive 31 and the corresponding one of the second terminals 22.

In the method for manufacturing the display panel in some embodiments, step S600 is further includes.

In step S600, an adhesion layer is formed between the first substrate and the driving substrate.

Specifically, as shown in FIG. 16 and FIG. 17, after step S500, step S600 is further included to form the adhesion layer 101 between the first substrate 11 and the driving substrate 20. The material, the forming process, and the function of the adhesion layer 101 are described in the above-mentioned embodiments and not repeated herein.

Sixth Embodiment

Figure 18:
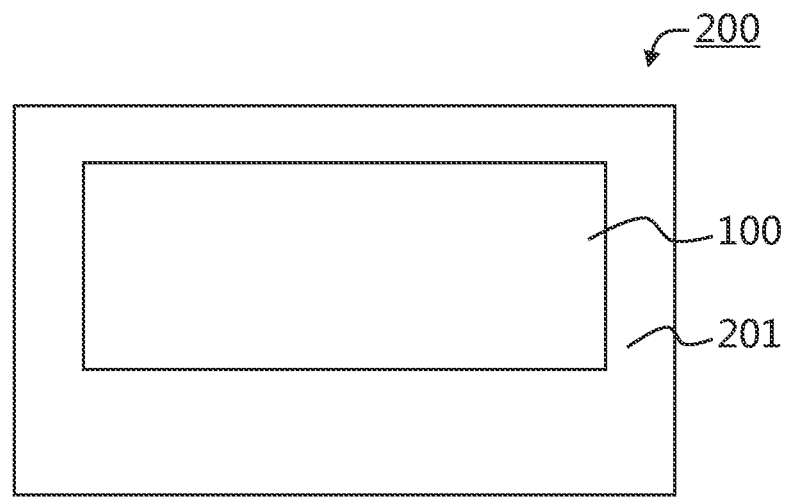
FIG. 18 illustrates a schematic diagram of a display terminal provided by an embodiment of the present disclosure.

Please refer to FIG. 18. FIG. 18 illustrates a schematic diagram of a display terminal 200 provided by an embodiment of the present disclosure.

The embodiment of the present disclosure provides a display terminal 200 including a terminal body 201 and the display panel 100 in any one of the above-mentioned embodiments. The terminal body 201 and the display panel 100 are combined into one.

Specifically, the display terminal 200 can be a mobile phone, a television, a notebook computer or the like.

An embodiment of the present disclosure further provides a display terminal 200. The display terminal is manufactured by the method for manufacturing the display panel in any one of the above-mentioned embodiments.

The display panel and the display terminal provided by the embodiments of the present disclosure are described in detail above. Although the principles and implementations of the present disclosure are described by using specific examples in this specification, the above-mentioned description of the embodiments is only intended to help understand the method and the core idea of the present disclosure. Moreover, those skilled in the art can make modifications to the specific implementations and an application range according to the idea of the present disclosure. In conclusion, the content of the specification is not intended to be construed as a limitation on the present disclosure.

What is claimed is:

1. A display panel, comprising:
   at least one display component, wherein the at least one display component comprises a first substrate, at least one first terminal disposed on the first substrate, and a light-emitting layer, and the light-emitting layer is electrically connected to the at least one first terminal;
   a driving substrate comprising a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and
   a conductive member electrically connected between the at least one first terminal and the corresponding one of the second terminals; and
   wherein the at least one display component comprises at least one via group, the via group is disposed between the at least one first terminal and the corresponding one of the second terminals, each of the at least one via group comprises a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias.

2. The display panel of claim 1, wherein the sub vias further extend into the at least one first terminal or the sub vias penetrate the at least one first terminal.

3. The display panel of claim 1, wherein in a direction parallel to the surface of the first substrate, the sub vias in each of the at least one via group are disposed side by side.

4. The display panel of claim 1, wherein a distance between the surface of the first substrate away from the groove and the groove is ranged from 1 μm to 3 μm.

5. The display panel of claim 1, wherein the at least one display component further comprises a third substrate and a connection hole penetrating the third substrate, the at least one first terminal is disposed between the first substrate and the third substrate, the light-emitting layer is disposed on the third substrate, and the light-emitting layer is electrically connected to the at least one first terminal through the connection hole.

6. The display panel of claim 1, wherein the at least one display component further comprises a barrier layer, the barrier layer is configured to block ultraviolet light, and the barrier layer is disposed at a side of the at least one first terminal away from the first substrate.

7. The display panel of claim 6, wherein the at least one display component further comprises a first insulating layer, the first insulating layer is disposed between the barrier layer and the at least one first terminal, and a material of the first insulating layer comprises an inorganic material.

8. The display panel of claim 7, wherein a material of the barrier layer comprises at least one of an opaque metal layer and amorphous silicon.

9. The display panel of claim 1, wherein in a direction parallel to the surface of the first substrate, a length of each of the sub vias is ranged from 3 μm to 30 μm.

10. The display panel of claim 9, wherein in the direction parallel to the surface of the first substrate, a distance between two adjacent ones of the sub vias is ranged from 5 μm to 20 μm.

11. The display panel of claim 9, wherein a shape of an orthographic projection of each of the sub vias on the first substrate comprises at least one of a circle, a triangle, a rectangle, a diamond, and a polygon.

12. The display panel of claim 1, wherein the conductive member comprises a first sub conductive member and a second sub conductive member, the first sub conductive member is filled in the groove and the sub vias, and the second sub conductive member is connected between the first sub conductive member and the corresponding one of the second terminals.

13. The display panel of claim 1, further comprising an adhesion layer, wherein the adhesion layer is disposed between the first substrate and the driving substrate.

14. The display panel of claim 2, wherein the at least one display component further comprises a third substrate and a connection hole penetrating the third substrate, the at least one first terminal is disposed between the first substrate and the third substrate, the light-emitting layer is disposed on the third substrate, and the light-emitting layer is electrically connected to the at least one first terminal through the connection hole.

15. The display panel of claim 14, wherein the at least one display component further comprises a barrier layer, the barrier layer is configured to block ultraviolet light, and the barrier layer is disposed at a side of the at least one first terminal away from the first substrate.

16. A display terminal, comprising a terminal body and a display panel, wherein the terminal body and the display panel are combined as one, and the display panel comprises:
at least one display component, wherein the at least one display component comprises a first substrate, at least one first terminal disposed on the first substrate, and a light-emitting layer, and the light-emitting layer is electrically connected to the at least one first terminal;
a driving substrate comprising a driving chip, a second substrate, and a plurality of second terminals disposed on the second substrate, wherein the at least one display component is disposed on the driving substrate, an orthographic projection of the at least one first terminal on the driving substrate at least partially overlaps with an orthographic projection of a corresponding one of the second terminals on the driving substrate, the driving chip is electrically connected to the second terminals, and the driving chip is configured to transmit a signal to the at least one first terminal through the corresponding one of the second terminals to drive the light-emitting layer for display; and
a conductive member electrically connected between the at least one first terminal and the corresponding one of the second terminals; and
wherein the at least one display component comprises at least one via group, the via group is disposed between the at least one first terminal and the corresponding one of the second terminals, each of the at least one via group comprises a groove and a plurality of sub vias, the groove is located on a surface of the first substrate toward the driving substrate, the sub vias penetrate a surface of the first substrate away from the groove, the sub vias are connected between the at least one first terminal and the groove, an orthographic projection of the groove on the driving substrate covers orthographic projections of the vias on the driving substrate, and the conductive member is at least filled in the groove and the sub vias.

17. The display terminal of claim 16, wherein the sub vias further extend into the at least one first terminal or the sub vias penetrate the at least one first terminal.

18. The display terminal of claim 16, wherein the at least one display component further comprises a third substrate and a connection hole penetrating the third substrate, the at least one first terminal is disposed between the first substrate and the third substrate, the light-emitting layer is disposed on the third substrate, and the light-emitting layer is electrically connected to the at least one first terminal through the connection hole.

19. The display terminal of claim 17, wherein the at least one display component further comprises a third substrate and a connection hole penetrating the third substrate, the at least one first terminal is disposed between the first substrate and the third substrate, the light-emitting layer is disposed on the third substrate, and the light-emitting layer is electrically connected to the at least one first terminal through the connection hole.

20. The display terminal of claim 16, wherein the at least one display component further comprises a barrier layer, the barrier layer is configured to block ultraviolet light, and the barrier layer is disposed at a side of the at least one first terminal away from the first substrate.

* * * * *